(12) United States Patent
Kimura

(10) Patent No.: US 12,483,197 B2
(45) Date of Patent: Nov. 25, 2025

(54) AMPLIFIER CIRCUIT

(71) Applicant: WILL SEMICONDUCTOR (SHANGHAI) CO. LTD., Shanghai (CN)

(72) Inventor: Hiroyuki Kimura, Miyagi (JP)

(73) Assignee: WILL SEMICONDUCTOR (SHANGHAI) CO. LTD., Shanghai (CN)

( * ) Notice: Subject to any disclaimer, the term of this patent is extended or adjusted under 35 U.S.C. 154(b) by 451 days.

(21) Appl. No.: 18/158,155

(22) Filed: Jan. 23, 2023

(65) Prior Publication Data
US 2024/0204732 A1 Jun. 20, 2024

(30) Foreign Application Priority Data
Dec. 14, 2022 (CN) .......................... 202211607904.1

(51) Int. Cl.
*H03F 3/45* (2006.01)
*H03F 1/08* (2006.01)

(52) U.S. Cl.
CPC ........... *H03F 1/08* (2013.01); *H03F 3/45179* (2013.01); *H03F 2200/372* (2013.01)

(58) Field of Classification Search
CPC .. H03F 1/08; H03F 3/45179; H03F 2200/372; H03F 2203/45212; H03F 1/086; H03F 3/45744; H03F 1/301; H03F 1/56; H03F 3/68
USPC ....................................................... 330/253
See application file for complete search history.

(56) References Cited

U.S. PATENT DOCUMENTS 4,216,435 A * 8/1980 Ahmed ................... G05F 1/561
330/257

OTHER PUBLICATIONS

Ekhtiari et al. "Bi-directional high-side current sense circuit for switch mode power supplies." 2014 21st IEEE International Conference on Electronics, Circuits and Systems (ICECS) (2014): pp. 630-633.
Shi et al. "An Ultra-Low Power Cycle-by-Cycle Current Limiter Suitable for Switching-Mode Power Supply with 2.2 MHz Frequency." 2019 IEEE 13th International Conference on Asic (ASICON) (2019): 4 pgs.

* cited by examiner

*Primary Examiner* — Andrea Lindgren Baltzell
*Assistant Examiner* — Khiem D Nguyen
(74) *Attorney, Agent, or Firm* — MUNCY, GEISSLER, OLDS & LOWE, P.C.

(57) ABSTRACT

An amplifier circuit includes a first transistor, through which a first input current is made to flow between the drain and the source; a second transistor, through which a second input current is made to flow between the drain and the source; a first-1 current source, which supplies a predetermined current to the gate of the first transistor; a first-2 current source, which supplies a predetermined current to the gate of the second transistor; a pair of adjustable resistors, which are connected in series between the gate of the first transistor and the gate of the second transistor; a connecting path, which connects a connection point of the pair of adjustable resistors to the drain of the first transistor; and a second current source, which supplies a current to the drain of the second transistor.

3 Claims, 4 Drawing Sheets

AMPLIFIER CIRCUIT

BACKGROUND OF THE INVENTION

1. Field of the Invention

The disclosure relates to offset adjustment of an amplifier circuit using a pair of transistors of which the gates are commonly connected.

2. Description of the Related Art

Conventionally, in an operational amplifier using a pair of transistors, offset compensation is required for the pair of transistors. For example, in a case of an operational amplifier in which the gates of a pair of transistors are connected with each other and there is a pair of inputs with bias current flowing from the sources, a pair of resistors are disposed at the sources of the transistors and offset compensation is carried out by adjusting these resistors.

An additional current source is required in a circuit in which a voltage drop across a resistor for adjustment is adjusted in a feedback manner using an operational amplifier. In addition, when the additional circuit is provided, there is also a problem of a delay in operation due to stray capacitance or the like here.

SUMMARY OF THE INVENTION

An amplifier circuit related to the disclosure includes:
- a first transistor M2, through which a first input current is made to flow between the drain and the source;
- a second transistor M4, through which a second input current is made to flow between the drain and the source;
- a first-1 current source ib1a, which supplies a predetermined current to the gate of the first transistor M2;
- a first-2 current source ib1b, which supplies a predetermined current to the gate of the second transistor M4;
- a pair of adjustable resistors Rt1 and Rt2, which are connected in series between the gate of the first transistor and the gate of the second transistor;
- a connecting path, which connects a connection point of the adjustable resistors Rt1 and Rt2 to the drain of the first transistor; and
- a second current source ib2, which supplies a current to the drain of the second transistor; wherein
- a current from the first-1 current source is supplied to the drain of the first transistor M2 via the first adjustable resistor Rt1, and a current from the first-2 current source is supplied to the drain of the first transistor M2 via the second adjustable resistor Rt2; and
- by relatively adjusting resistance values of the first adjustable resistor and the second adjustable resistor, offsets of gate voltages of the first transistor and the second transistor can be adjusted.

According to the amplifier circuit related to the disclosure, offset adjustment can be carried out by trimming a pair of resistors disposed in a path to the gate of a transistor, and an additional operational amplifier or the like is not required. In addition, an increase in stray capacitance can be suppressed.

PREFERRED EMBODIMENT OF THE PRESENT INVENTION

Hereinafter, embodiments of the disclosure are described with reference to the drawings. It should be noted that the following embodiments are not intended to limit the scope of the disclosure, and configurations formed by selectively combining multiple examples are also included in the disclosure.

"Circuit Configuration"

Figure 1:
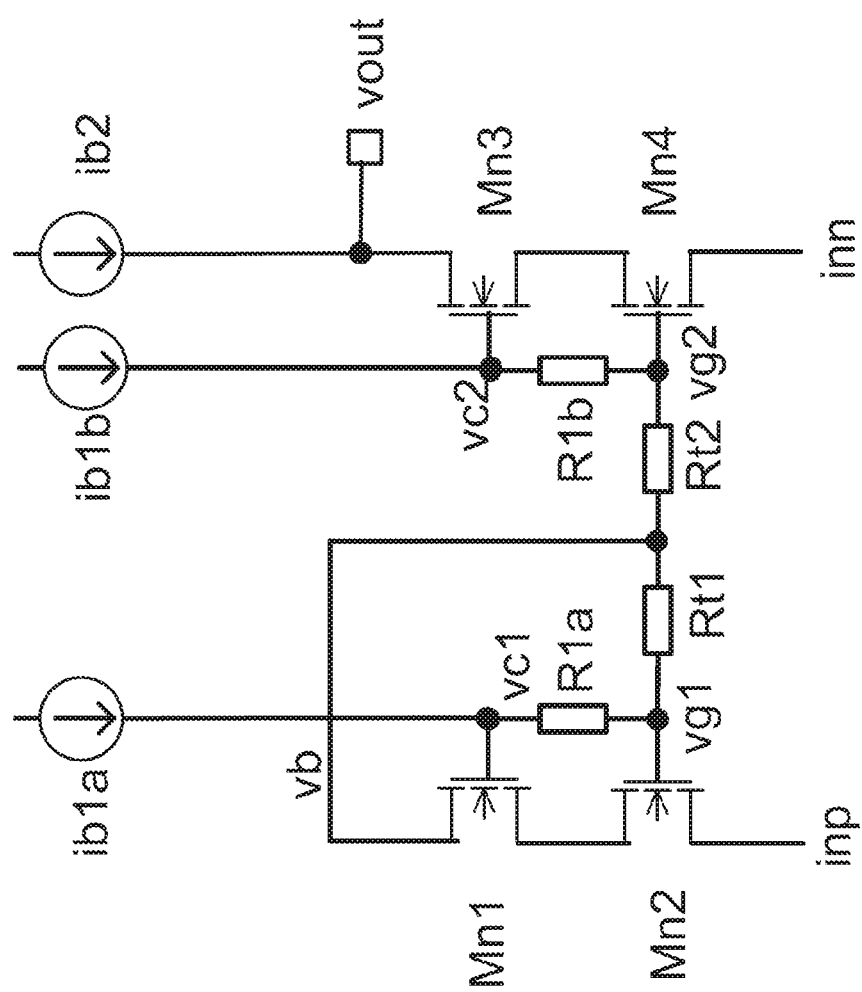
FIG. 1 is a circuit diagram showing the configuration of an amplifier circuit according to an embodiment of the disclosure.

FIG. 1 is a circuit diagram showing the configuration of an amplifier circuit according to an embodiment of the disclosure. In the circuit, an N-type metal-oxide-semiconductor field-effect transistor (MOSFET) is used as a transistor. A P-type MOSFET can be used to constitute the circuit. In this case, it is required to appropriately invert the polarity, such as the current direction of the circuit.

The amplifier circuit includes four transistors Mn1 to Mn4, the gates of the transistor Mn2 and the transistor Mn4 are commonly connected, and the transistors Mn1 and Mn3 are connected in cascode to these transistors Mn2 and Mn4. The transistor Mn2 is referred to as the first transistor, and the transistor Mn4 is referred to as the second transistor. In addition, the transistors Mn1 and Mn3 are referred to as the cascode transistor.

The drain of the transistor Mn2 is connected to the source of the transistor Mn1, and a first bias current inp is drawn out from the source of the transistor Mn2.

The gate of the transistor Mn1 is connected to a first-1 current source ib1a. The gate of the transistor Mn1 is further connected to the gate of the transistor Mn2 via a resistor R1a.

The gate of the transistor Mn2 is further connected to the drain of the transistor Mn1 via a resistor Rt1.

In addition, the drain of the transistor Mn4 is connected to the source of the transistor Mn3, and a second bias current inn is drawn out from the source of the transistor Mn4.

The gate of the transistor Mn3 is connected to a first-2 current source ib1b. The gate of the transistor Mn3 is further connected to the gate of the transistor Mn4 via a resistor R1b. Here, the resistors R1a and R1b may be omitted in a case that gate voltages of the transistor Mn2 and the transistor Mn4 can be set to appropriate values by the first-1 current source ib1a and the first-2 current source ib1b.

The gate of the transistor Mn4 is further connected to the resistor Rt1 via a resistor Rt2. That is, the gate of the transistor Mn2 and the gate of the transistor Mn4 are connected by the resistors Rt1 and Rt2, which are a pair of adjustable resistors. A connection point between the resistors Rt1 and Rt2 is connected to the drain of the transistor Mn1. The resistor Rt1 is referred to as the first adjustable resistor, and the resistor Rt2 is referred to as the second adjustable resistor.

The drain of the transistor Mn3 is connected to a second current source ib2 and is connected to an output end vout.

Thus, a current from the first-1 current source ib1a is supplied to the drain of the transistor Mn1 via the resistor R1$a$ and the resistor Rt1, and a current from the first-2 current source ib1$b$ is supplied to the drain of the transistor Mn1 via the resistor R1$b$ and the resistor Rt2, then flows through the transistor Mn1 and the transistor Mn2, and flows out as a first current inp.

In addition, a current from the second current source ib2 flows through the transistor Mn3 and the transistor Mn4 and flows out as a second current inn. Then, the drain voltage of the transistor Mn3 is output as a voltage vout from the output end vout.

Here, when the gate voltage of the transistor Mn1 is set as vc1, the gate voltage of the transistor Mn2 is set as vg1, the voltage of the connection point between the resistor Rt1 and the resistor Rt2 (the drain of the transistor Mn1) is set as vb, the gate voltage of the transistor Mn3 is set as vc2, and the gate voltage of the transistor Mn4 is set as vg2, $$vc1 - vg1 = ib1a * R1a$$

$$\text{and } vc2 - vg2 = ib1b * R1b.$$

Thus, the difference between the gate voltages of the transistor Mn1 and the transistor Mn2 that are connected in cascade, and the difference between the gate voltages of the transistor Mn3 and the transistor Mn4 that are connected in cascade are independent of the value of the resistor Rt1 or the resistor Rt2, and are not affected thereby.

In addition, at the time of design, the size or the resistance value of the transistor is set so that ib2=ib1$a$+ib1$b$. Thus, a current synthesized at the connection point between the resistor Rt1 and the resistor Rt2 becomes ib1$a$+ib1$b$, and thus the current flowing through the transistor Mn1 and the transistor Mn2 becomes ib2 (=ib1$a$+ib1$b$).

Note that the size of the transistor Mn1 and the size of the transistor Mn3 may be set to be the same, and the size of the transistor Mn2 and the size of the transistor Mn4 may be set to be the same.

In order to cause the drain-source voltages Vds of the transistor Mn2 and the transistor Mn4 to be the same, a voltage drop at the resistor R1$a$ and a voltage drop at the resistor R1$b$ are the same.

Thus, $$R1a = R1b.$$

Under this condition, an offset voltage in the input of the amplifier circuit can be adjusted by setting resistance values of the resistor Rt1 and the resistor Rt2.

That is, an offset voltage vos between an input end inp and an input end inn is $$vinp - vinn,$$

which is given by $$vg1 - vg2.$$

Here, $$vg1 - vb = ib1a * Rt1$$

$$vg2 - vb = ib1b * Rt2.$$

By subtracting the above two expressions, the offset voltage vos can be expressed as $$vos = vg1 - vg2 = ib1a * Rt1 - ib1b * Rt2.$$

Here, $$ib2/2 = ib1a = ib1b.$$

When the adjustment amounts of the resistor Rt1 and the resistor Rt2 are set as t, $$Rt1 = Rt * (1 + t),$$

and thus $$Rt2 = Rt * (1 - t)$$
$$vos = ib1a * Rt1 - ib1b * Rt2 = ib2/2 * (Rt1 - Rt2).$$
$$= ib2/2 * Rt * 2t = ib2 * Rt * t (-1 < t < 1)$$

In this manner, in the amplifier circuit of FIG. 1, the offset voltage can be adjusted by increasing the resistance value of one and decreasing the resistance value of the other by the adjustment value t (trimming) while maintaining the sum of the resistance values of the resistors Rt1 and Rt2.

In this manner, in this embodiment, by the current flowing through the pair of resistors Rt1 and Rt2 connecting the gates of the transistor Mn2 and the transistor Mn4 with each other, the offset voltage at the pair of input ends can be compensated for. Therefore, an extra offset adjustment circuit or the like is not required. Because a bias current in the series connection between the transistor Mn1 and the transistor Mn2 that are diode-connected can be used to compensate for the offset voltage, a dedicated current source for offset compensation is not required.

In addition, in the embodiment, cascode connection is used, and thus the drain-source voltages of the transistor Mn2 and the transistor Mn4 can be maintained the same, which makes it possible to carry out highly precise current control.

"Another Configuration 1"

Figure 2:
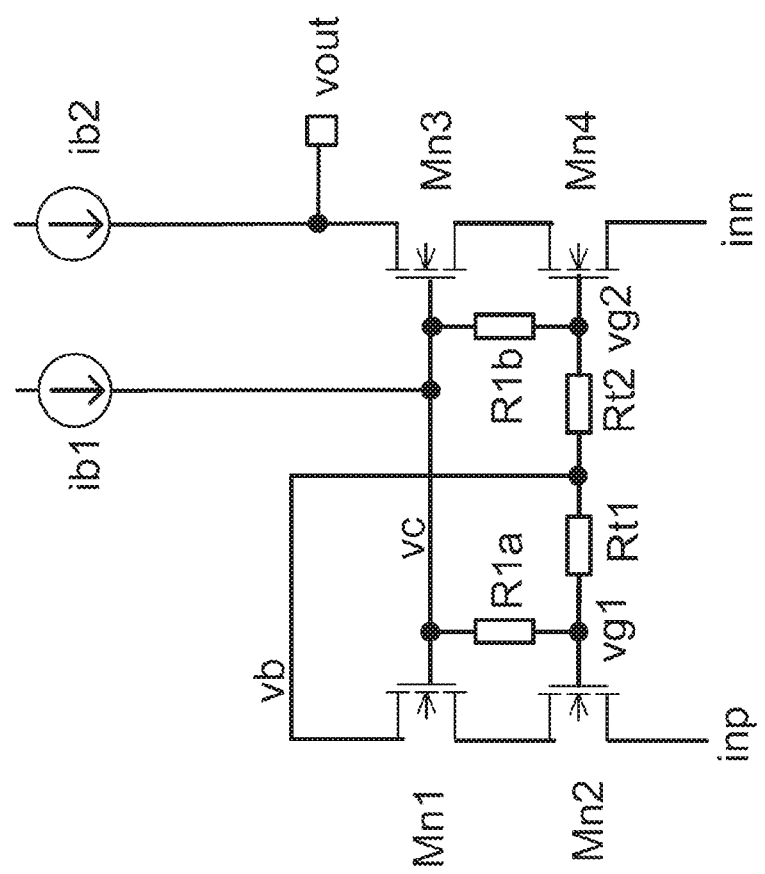
FIG. 2 is a circuit diagram showing the configuration of an amplifier circuit according to another embodiment of the disclosure.

FIG. 2 is a circuit diagram showing the configuration according to another embodiment of the disclosure. In this example, the first-1 current source ib1$a$ and the first-2 current source ib1$b$ in the example of FIG. 1 are combined into a single first current source ib1. Then, a current from the single first current source ib1 is divided into two halves and respectively supplied to the resistor R1$a$ and the resistor R1$b$. The same operations as those described above can be obtained with this configuration as well.

Figure 3:
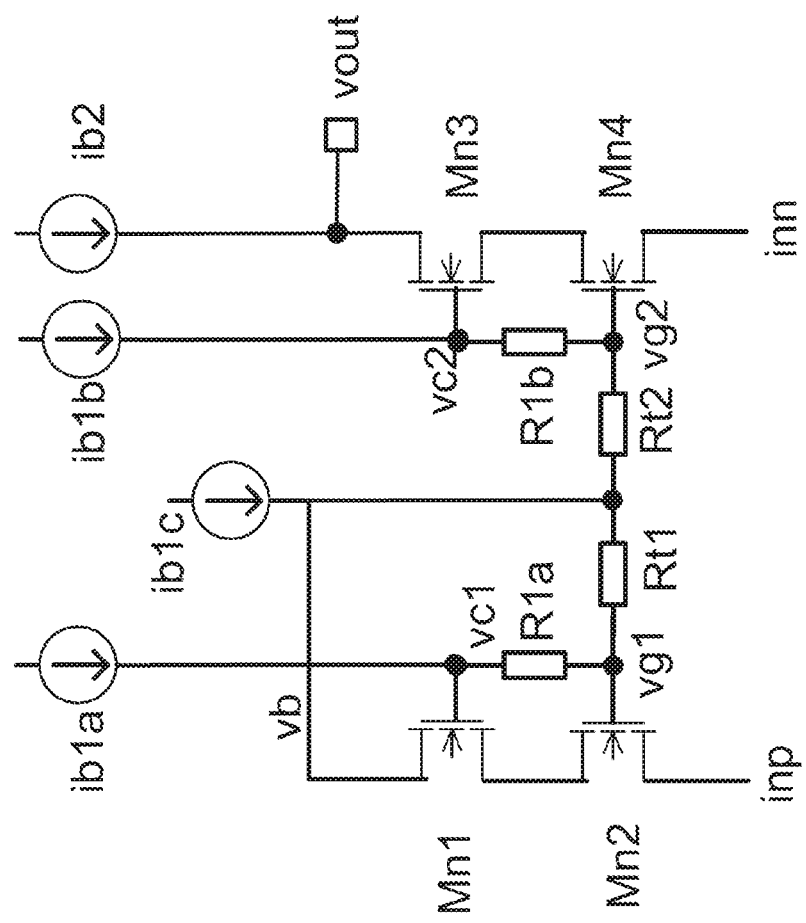
FIG. 3 is a circuit diagram showing the configuration of an amplifier circuit according to still another embodiment of the disclosure.

FIG. 3 is a circuit diagram showing the configuration according to still another embodiment of the disclosure. In this example, in addition to the first-1 current source ib1$a$ and the first-2 current source ib1$b$ in the example of FIG. 1, a first-3 current source ib1$c$ is arranged.

The first-3 current source ib1$c$ adds a current ib1$c$ to the current flowing from the connection point between the resistor Rt1 and the resistor Rt2 toward the transistor Mn1. Thus, $$ib1 = ib2 = ib1a + ib1b + ib1c,$$

the current ib1$a$ and the current ib1$b$ are relatively reduced, and operations corresponding to the input currents inp and inn can be obtained.

Note that in the configuration of FIG. 3, in a case that the adjustment amounts of the resistor Rt1 and the resistor Rt2 may be small, the current flowing through the resistor Rt1 and the resistor Rt2 is small by the amount corresponding to the current ib1$c$, and thus the total resistance value of the resistor Rt1 and the resistor Rt2 can be set to a relatively large value. The resistor on the IC has a fixed sheet resistance, and depending on the process technology, the layout area may increase in order to create a resistor having a small resistance value. In the example of FIG. 3, this disadvantage can be eliminated.

Figure 4:
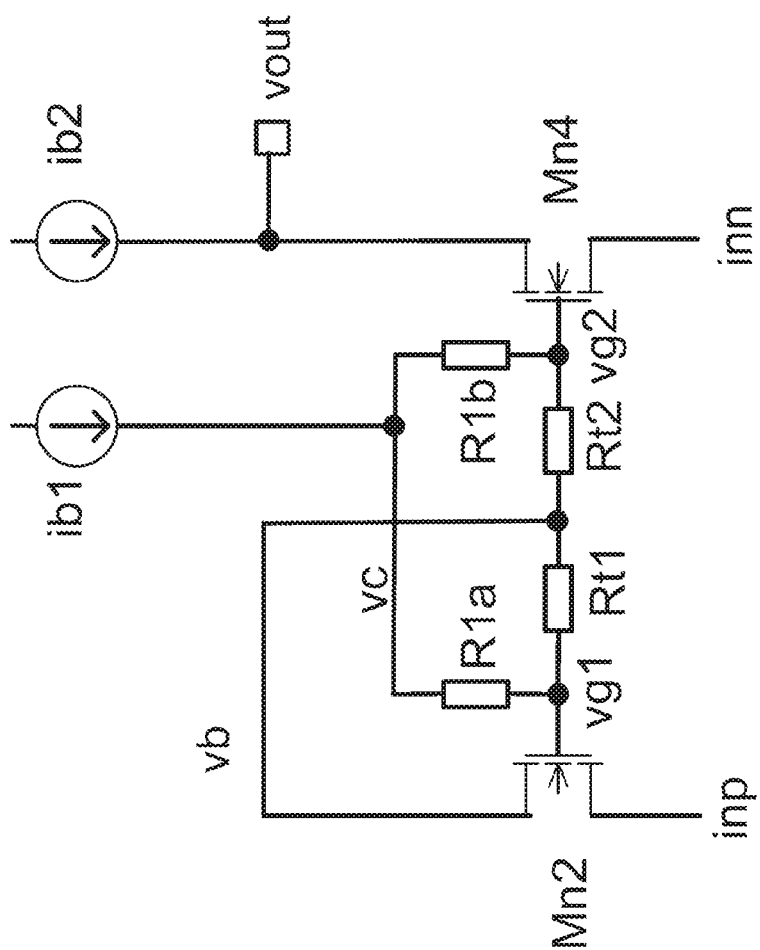
FIG. 4 is a circuit diagram showing the configuration of an amplifier circuit according to yet another embodiment of the disclosure.

FIG. 4 is a circuit diagram showing the configuration according to yet another embodiment of the disclosure. In this example, the first-1 current source ib1$a$ and the first-2 current source ib1$b$ are combined into the single first current source ib1 in a similar manner as the example of FIG. 2, and the transistor Mn1 and the transistor Mn3 for cascode connection are omitted. Thus, the first current source ib1 is connected to the gate of the transistor Mn2 via the resistor R1$a$, and is connected to the gate of the transistor Mn4 via the resistor R1$b$. Although the precision of the current amounts of the transistor Mn2 and the transistor Mn4 is reduced due to this configuration, offset compensation using the resistors Rt1 and Rt2 can be similarly carried out.

What is claimed is:

1. An amplifier circuit, comprising:
   a first transistor, through which a first input current is made to flow between the drain and the source;
   a second transistor, through which a second input current is made to flow between the drain and the source;
   a first-1 current source, which supplies a predetermined current to the gate of the first transistor;
   a first-2 current source, which supplies a predetermined current to the gate of the second transistor;
   a pair of adjustable resistors, which are connected in series between the gate of the first transistor and the gate of the second transistor;
   a connecting path, which connects a connection point of the pair of adjustable resistors to the drain of the first transistor; and
   a second current source, which supplies a current to the drain of the second transistor; wherein
   a current from the first-1 current source is supplied to the drain of the first transistor via one of the pair of adjustable resistors, and a current from the first-2 current source is supplied to the drain of the first transistor via the second adjustable resistor; and
   by relatively adjusting resistance values of the first adjustable resistor and the second adjustable resistor, offsets of gate voltages of the first transistor and the second transistor is capable of being adjusted.

2. The amplifier circuit according to claim 1, further comprising:
   a first resistor, which is disposed in a connection path between the first-1 current source and the gate of the first transistor; and
   a second resistor, which is disposed in a connection path between the first-2 current source and the gate of the second transistor.

3. The amplifier circuit according to claim 1, wherein the drain side of the first transistor and the drain side of the second transistor are respectively added with a cascode transistor.

\* \* \* \* \*